(12) United States Patent
Pollard et al.

(10) Patent No.: US 11,595,017 B2
(45) Date of Patent: Feb. 28, 2023

(54) HIGH Q ACOUSTIC RESONATOR WITH DIELECTRIC FLAPS

(71) Applicant: RF360 EUROPE GMBH, Munich (DE)

(72) Inventors: Thomas Pollard, Longwood, FL (US); Alexandre Augusto Shirakawa, San Diego, CA (US)

(73) Assignee: RF360 Europe GMBH, Munich (DE)

( * ) Notice: Subject to any disclaimer, the term of this patent is extended or adjusted under 35 U.S.C. 154(b) by 378 days.

(21) Appl. No.: 16/636,789

(22) PCT Filed: Aug. 2, 2018

(86) PCT No.: PCT/EP2018/070999
§ 371 (c)(1),
(2) Date: Feb. 5, 2020

(87) PCT Pub. No.: WO2019/034442
PCT Pub. Date: Feb. 21, 2019

(65) Prior Publication Data
US 2020/0366266 A1    Nov. 19, 2020

(30) Foreign Application Priority Data
Aug. 17, 2017    (DE) .................... 10 2017 118 804.5

(51) Int. Cl.
*H03H 9/02*    (2006.01)
*H03H 9/13*    (2006.01)
*H03H 9/17*    (2006.01)

(52) U.S. Cl.
CPC ........ *H03H 9/02086* (2013.01); *H03H 9/132* (2013.01); *H03H 9/173* (2013.01); *H03H 9/175* (2013.01)

(58) Field of Classification Search
CPC .... H03H 9/02086; H03H 9/132; H03H 9/173; H03H 9/175; H03H 9/02125;
(Continued)

(56) References Cited

U.S. PATENT DOCUMENTS 8,384,497 B2 * 2/2013 Zhang ................ H03H 9/02118
310/365
2008/0174389 A1 7/2008 Mori et al.
(Continued)

FOREIGN PATENT DOCUMENTS

CN    101924529 A    12/2010

OTHER PUBLICATIONS

International Search Report and Written Opinion dated Nov. 15, 2018, corresponding to Application No. PCT/EP2018/070999.

*Primary Examiner* — Jeffrey M Shin
(74) *Attorney, Agent, or Firm* — Patterson + Sheridan LLP

(57) ABSTRACT

A high Q acoustic BAW resonator with high coupling and improved spurious mode suppression is given. The BAW resonator comprises an active resonator region (AR) formed by an overlap of the three layers bottom electrode (BE), piezoelectric layer (PL) and top electrode layer (TE). An inner-flap (IF) is formed by a dielectric 3D structure sitting on a marginal region (MR) of the active resonator region (AR) or adjacent thereto, extending inwardly towards the center thereof and having a section that runs in parallel and distant to the top surface of the resonator keeping an inner gap (IG) thereto or an angle Θ.

18 Claims, 3 Drawing Sheets

(58) Field of Classification Search
CPC ............... H03H 9/02157; H03H 9/171; H03H 9/02118; H03H 9/02062; H03H 9/0211; H03H 9/02; H03H 2003/021; H03H 2003/025

See application file for complete search history.

(56) References Cited

U.S. PATENT DOCUMENTS

| | | |
|---|---|---|
| 2014/0118087 A1 | 5/2014 | Burak et al. |
| 2014/0225683 A1 | 8/2014 | Burak et al. |
| 2017/0047907 A1 | 2/2017 | Burak et al. |

* cited by examiner

HIGH Q ACOUSTIC RESONATOR WITH DIELECTRIC FLAPS

CROSS-REFERENCE TO RELATED APPLICATIONS

This application is a national stage application under 35 U.S.C. 371 of PCT/EP2018/070999, filed Aug. 2, 2018, which claims the benefit of German Application No. 10 2017 118 804.5, filed Aug. 17, 2017, both of which are incorporated herein by reference in their entireties.

BAW resonators in practice are finite in size along their lateral dimensions and have termination regions consisting of one of the following three types:
 (i) no electrode interconnect;
 (ii) top electrode interconnect, or
 (iii) bottom electrode interconnect.

Top and bottom interconnects are used to electrically connect a resonator's terminal to other elements in a circuit e.g. to other resonators arranged in a ladder type configuration forming a frequency filter.

For case (i) the termination region is typically formed by first terminating the top electrode, followed by terminating of bottom electrode, or by terminating both the top and bottom electrode at approximately the same location.

For cases (ii) and (iii) the termination region is formed by terminating the bottom and top electrode, respectively, while allowing the other electrode to extend to another circuit element, such as a via or another resonator.

Resonator termination regions are typically the main source of spurious mode excitation. At these locations the localized internal laterally acting forces acting back on the materials under compression or extension are not cancelled as they are near the center of the resonator. This results in excitation of lateral modes and other non-desired bulk modes which propagate back towards the resonator interior or outward away from the active resonator area. In either case, the energy is typically considered lost and results in an overall lower quality factor (Q) for the mode of interest—in this case the thickness extensional. In addition, spurious signals can show up in the electrical response of the device at frequencies where the lateral modes propagate back and forth in the active area and resonate when the lateral cavity dimensions have a particular relationship with the lateral mode characteristic wavelength.

Optimization of the termination geometry can reduce the spurious mode excitation and allow more energy to be contained within the resonator, thus improve the device Q and reduce the level of spurious signals over the device's spectrum of interest. In turn, properly optimized termination geometry improves the overall filter performance in-band and out-of-band with out-of-band performance being critical in multiplexing applications.

It is an objective of the present invention to provide a BAW resonator containing novel lateral termination geometries that provide high Q, low-spurious signal corruption, and near-maximum electro-mechanical coupling (for a given layer stack and resonator size).

These and other objects are solved by a BAW resonator according to claim 1.

Further embodiments and advantageous variations can be taken from sub-claims.

This invention discloses novel resonator termination geometries that improve the overall resonator performance. An approach for mode suppression and Q enhancement is given. With the invention, improved Q from ~1800 to 3000 around 2 GHz is expected based on proven simulation tools. In addition the electro-mechanical coupling coefficient $kt^2$ is improved from ~6.0 to 6.3% for the same layer stack and resonator size.

A BAW resonator comprises at least a substrate, a bottom electrode, a piezoelectric layer and a top electrode which may be arranged directly above one another in the given sequence from bottom to top. Below and above the bottom and top electrodes, respectively, are acoustic reflectors that are used to contain energy within the stack, which are generally air interfaces (e.g. with a film bulk acoustic resonator—FBAR) or an acoustic bragg structure containing alternating layers of high and low acoustic impedance materials (e.g. with a solidly mounted resonator—SMR), or a combination or both (e.g. air reflector on top and Bragg on bottom—being the most common SMR type). An active resonator region is defined by an overlap of the bottom electrode layer, the piezoelectric layer, the top electrode layer, and the top and bottom acoustic reflectors, and does not include the lateral termination structures. In this active region it is preferred to excite only modes that propagate in a vertical direction (e.g. the thickness extensional mode).

To prevent excitation and propagation of spurious lateral modes this invention proposes to use an inner-flap arranged on a marginal region of the active resonator region or adjacent thereto. The inner-flap is a dielectric 3D structure that extends laterally and inwardly towards the central area of the resonator region and is distant to the top surface of the resonator and separated by a gap. A dielectric anchor of the flap attaches to the resonator device surface outside the active resonator area or as close to the edge of the active region as the process allows and extends for a finite length forming a feature denoted as an outer-lap. Furthermore, another flap, denoted as the outer-flap, can be incorporated into the device, using the same dielectric layer that is used to form the inner-flap and outer-lap, which extends laterally and outwards away from the central area of the active resonators region and distant to top surface of the resonator and separated by a another gap.

The novel dielectric inner-flap disclosed is designed to be self-resonant like a cantilever mode fixed at one end and free on other around the same frequency that the active resonator region is resonant or anti-resonant (in the thickness extensional mode). Under this condition the thickness extensional mode profile along the later dimensions of the resonator becomes very uniform throughout the device active area—more so than that observed with prior art near the resonator marginal regions—which tends to maximize the device electromechanical coupling coefficient, $kt^2$. The passive dielectric outer-lap region allows smooth tapering of the thickness extensional mode profile outside of the active area and reduces spurious lateral mode excitation. The outer-lap width can be optimized so that laterally leaking energy is reflected back at its termination and focused back to the active resonator region in a constructive manner, which further improves the device Q. Because the outer-lap structure is dielectric, passive, and external to the active area, incorporating it does not reduce the $kt^2$ as it does for other known spurious modes suppression techniques that use conductive overlaps and outer-flaps that are electrically in contact with the active top electrode.

In the resonator marginal region with a top electrode connection, additional problems with lateral modes can arise.

The top electrode connection metal is typically required to be protected from corrosion via encapsulating the entire device with a dielectric layer—here it doubles also as a frequency trimming layer. If the passivation layer is too similar (in terms of etch selectivity) to the inner-flap/outer-lap/outer-flap material, then creating an outer-lap in connection region becomes problematic as its patterning can expose a portion of the metal to the environment and lead to top electrode corrosion. To circumvent this, the outer-lap can be allowed to extend "infinitely"—i.e. not be etched on the region of top electrode connection. As an alternative, in this region one can still incorporate an outer-lap when also combining with an outer-flap.

Preferably the inner-flap and outer-lap are arranged along the whole perimeter of the active resonator region. The outer-flap is optional and is arranged mainly in the region of the top electrode connection. At those regions where inner-flap outer-lap, and optionally outer-flap are present, these objects can be formed by a common dielectric 3D structure according to an embodiment. The final device is attained for example by modifying a post-trimmed and passivated resonator/filter, by first, coating the wafer with a sacrificial material, then patterning the sacrificial material (e.g. remove in outer-lap regions), then coating the wafer with the 3D dielectric material, then patterning inner/outer-flaps in the dielectric, and then lastly removal of the sacrificial material.

The lengths of the inner-flap, outer-lap, and optional outer-flap, are desired to be uniform in each of the termination regions i, ii, and iii, but are not required to be the same from region type to region type. The gap heights of all inner/outer-flaps are the same (but not required to be) given a single sacrificial layer process and single dielectric layer process as described above. The effective outer-lap total thickness can be considered larger than inner/outer-flap thickness if the underlying passivation layer thickness is included. In an alternative process the underlying passivation layer and or electrode layer could be removed together with the sacrificial layer opening to: i) reduce the outer-lap effective thickness; and ii) to improve control of 3D dielectric structure alignment to the top electrode. Near the marginal region of the resonator the effective thickness of the top electrode is thinner when incorporating an optional feature denoted as an under-lap. This feature is useful to reduce spurious mode coupling at frequencies below the device's fundamental resonance (for a type II stack—not useful for a type I stack) when properly dimensioned. Typically the under-lap structure is formed by recessing the electrode thickness, but in this invention it is formed in a novel way by trimming the passivation layer in selected locations around the resonator marginal region.

A feature denoted as a trench, meaning a trench in the passivation and inner-lap, outer-lap, and optional outer-lap layers down to the piezoelectric, can be formed during the dielectric 3D structure patterning. The lateral dimension can be tuned to further improve device Q. The Q enhancement can be attributed to creating additional reflection sites for remaining leaking later energy that when directed back towards the active resonator act constructively.

Dielectric 3D structures and the passivation layer may comprise the same material and may be formed form e.g. silicon nitride which is usually referred to as SiN. But other dielectric materials preferably inorganic oxides, nitrides and carbides are preferred.

The outer-lap may sit on the marginal region of the top electrode partly covering the surface thereof. Alternatively, the outer-lap does not cover any part of the top electrode in the active resonator region.

According to an embodiment the 3D structure is formed from a layer of unitary thickness over the resonator surface with a mostly conformal patterned sacrificial material. Hence, the top surface of the 3D dielectric follows the topography of the underlying surface where it is in intimate contact thereto.

The invention can be used with BAW resonators of different construction types—e.g. film bulk acoustic wave resonators (FBAR) or solidly mounted resonator (SMR). A SMR type BAW resonator is mounted in intimate contact of active resonator region and substrate. To help contain the acoustic energy within the resonator, a Bragg mirror is arranged between substrate surface and bottom electrode. The mirror comprises alternating layers of high and low acoustic impedance. The greater the impedance difference the better the reflection coefficient or the lower the required number of mirror layers being required.

Moreover, the invention can be used at an FBAR which needs an air-filled cavity directly below the active resonator region. The cavity is formed as a recess in the substrate or by substrate removal from the bottom side forming a membrane.

In the following the invention will be explained in more detail with reference to specific embodiments and the accompanying figures. The figures are schematically only and are not drawn to scale. For better understanding some detail may be depicted in enlarged form.

Figure 1:
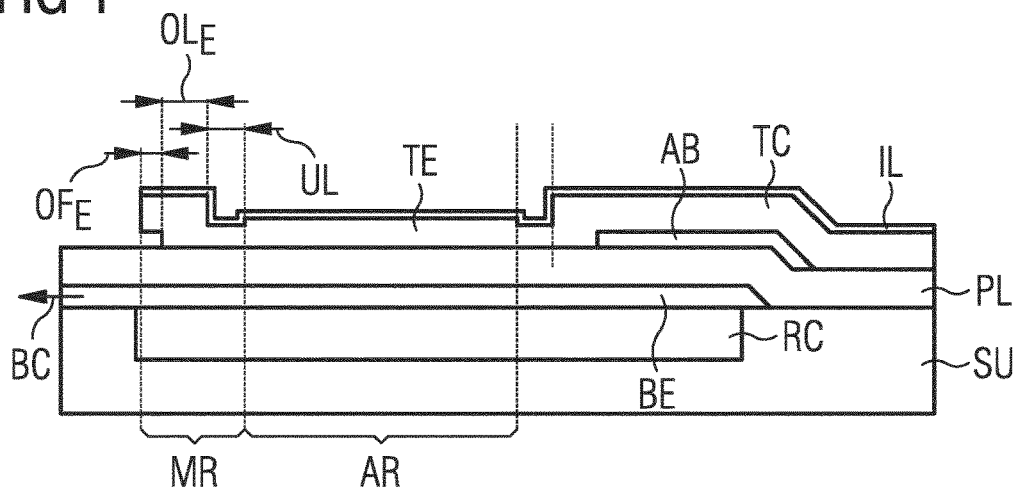
FIG. 1 shows a cross-sectional view through a BAW resonator according to the art.

A cross-sectional view through BAW resonator according to the art is depicted in FIG. 1. In a substrate SU of silicon for example a recess RC is formed. The active resonator region AR is arranged above the recess RC and comprises a substrate a bottom electrode BE, a piezoelectric layer PL and a top electrode TE. The bottom electrode Bauelement covers the recess RC. Under-lap UL, over-lap $OL_E$, and outer-flap $OF_E$ structures are patterned out of the top electrode TE for termination regions of type i (none) and iii (bottom). In the under-lap $UL_E$ region the top electrode is thinner than in the active region AR. In the over-lap $OL_E$ region the top electrode TE is thicker than the active region AR. Here, the outer-flap $OF_E$ is made of metal and extends outward from the active region AR. For the type ii termination region (top) an under-lap UL, over-lap $OL_E$, and an acoustic bridge AB connection are formed. The acoustic bridge forms the tope elecectrode connection TC for connecting the top electrode to another resonator or a terminal of a filter. A passivation layer IL is applied over the top electrode TE, but does not passivate the sides of the electrode or the underside of the top electrode connection connection TC (air bridge).

Figure 2:
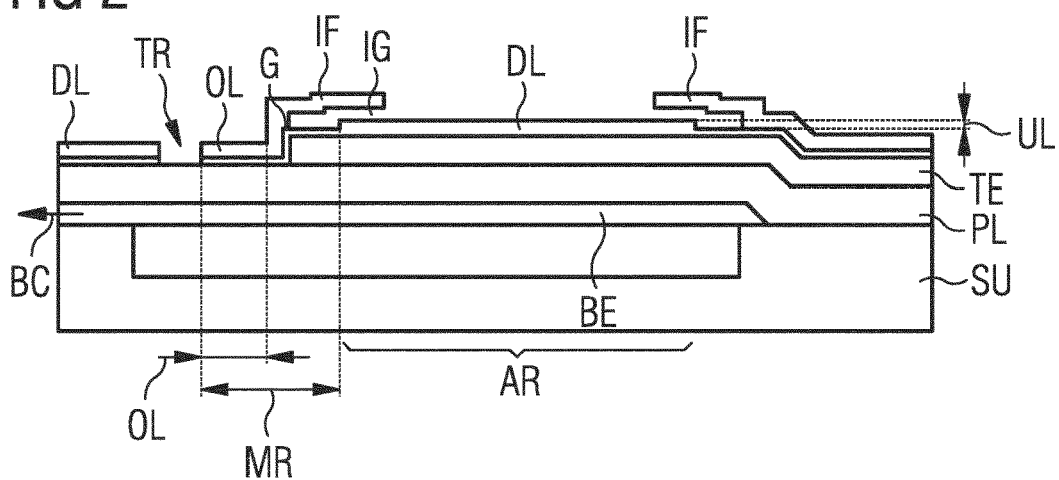
FIG. 2 shows a cross-sectional view through a BAW resonator according an embodiment with inner-flaps and outer-lap, trench, and under-lap formed by patterning of the passivation layer, whereas the left side of the image shows a bottom electrode connection region and the right side of the image shows a top electrode region.

FIG. 2 shows a cross-sectional view through a BAW resonator according to a first embodiment. Along the total perimeter of the active resonator region AR a dielectric 3D structure structured from a dielectric layer DL forms inner flaps IF. A top electrode connection TC is structured from an extension of the top electrode layer TE. The top electrode TE has same thickness in the active region AR and the top electrode conection TC. The outer-lap OL is the part of the dielectric layer that directly contacts the piezoelectric layer PL along the perimeter of the active region AR but not at the region of the top electrode connection TC.

In a section of the passivation layer IS that covers the top electrode TE in the margin region MR the thickness of the passivation layer IL and/or dielectric layer DL is reduced by an under-lap UL.

The 3D structure/dielectric layer DL has an overlap with the region where the under-lap UL is formed. This overlap is a small margin having a width G and extends along the whole perimeter of the active region with the exception of the section where the top electrode connection TC is formed. In this margin the 3D structure forming the inner-flap IF sits on the passivation layer IL at a region where it overlaps the bottom electrode BE.

In a trench TR that structures the dielectric layer DL/passivation layer IS the top surface of the piezoelectric layer PL is exposed but not in the top electrod connection TC.

Between inner-flap IF and dielectric layer an inner gap IG is formed where the dielectric 3D structure is in a constant distance to the dielectric surface. Over the top electrode connection passivation layer IS and dielectric layer DL have the original thickness.

The 3D structure/dielectric layer DL is formed from e.g. SiN and sits on the passivation layer IL. The inner flap IF that is the inwardly projecting part of the 3D structure follows the topography of the top electrode layer TE in a constant distance keeping the inner gap IG of constant height. Hence, the inner flap follows the step from the under-lap UL to the active region AR.

The bottom electrode BE may be elongated at on side edge of the active resonator region AR to form a bottom electrode connection BC.

A thin passivation layer IL of e.g. SiN or $SiO_2$ covers the total surface of the top electrode TE and the top electrode connection TC. The thickness of the passivation layer IL is smaller than the thickness of the inner flaps and hence smaller than the thickness of the layer the 3D structure is structured from.

Under the active resonator region AR the substrate has an air-filled recess RC like shown in the prior art resonator of FIG. 1.

Bottom and top electrode BE, TE are made commonly used materials. The materials may be chosen from tungsten W, molybdenum Mo, and AlCu alloy or the electrodes may be multilayer hybrid electrodes e.g. W/AlCu. The piezoelectric layer PL may comprise AlScN that is aluminium nitride AlN that additionally contains scandium nitride ScN.

The substrate SU preferably comprises silicon Si but may made from other suitable material too like HTCC and LTTC ceramics for example.

Passivation layer IL and dielectric 3D structures may comprise the same material e.g. SiN.

The non-connection region (not shown) is similar to the bottom electrode connection region, but has a bottom electrode that is terminated after the outer-lap termination.

Figure 3:
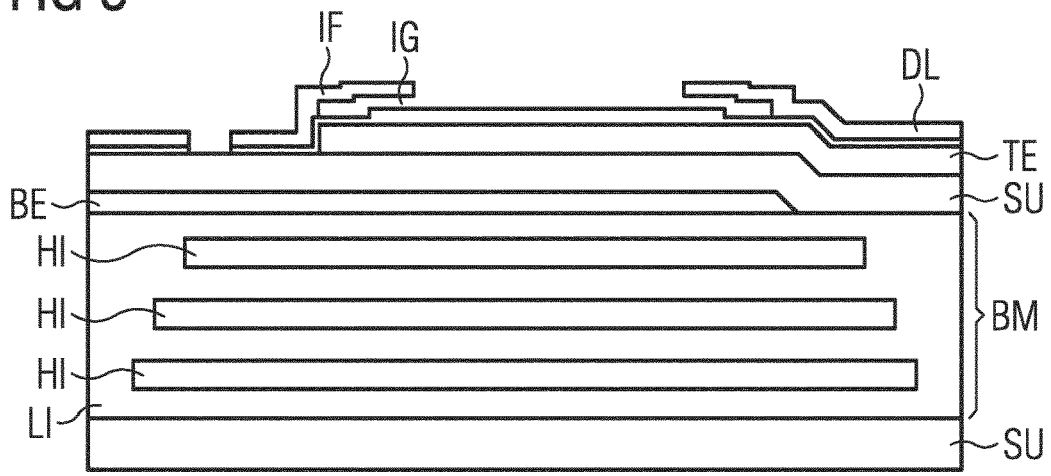
FIG. 3 shows an embodiment that has the same features of the FIG. 2 embodiment, but is an SMR resonator type rather than an FBAR type.

FIG. 3 shows a second embodiment of a new BAW resonator similar to the first embodiment. As an alternative to the recess RC, a Bragg mirror BM is arranged between substrate SU and bottom electrode BE. The Bragg mirror BM comprises alternating layers of a first material HI of high acoustic impedance and a second material LI of low acoustic impedance. The different layers of the acoustic Bragg mirror BM may form layers with decreasing area that a stepped mesa structure is formed. For clarity reasons the stepped Bragg mirror is not depicted.

The first material of high acoustic impedance HI may be a metal like thungsten W for example. The second material of low acoustic impedance LI may be a dielectric like $SiO_2$ for example. Usually, the high impedance layers HI are structured and embedded with the second material that is a dielectric to avoid coupling with neighbored resonators. Bottom electrode BE and the further layers above are embodied the same way as shown and explained with reference to FIG. 2.

Figure 4:
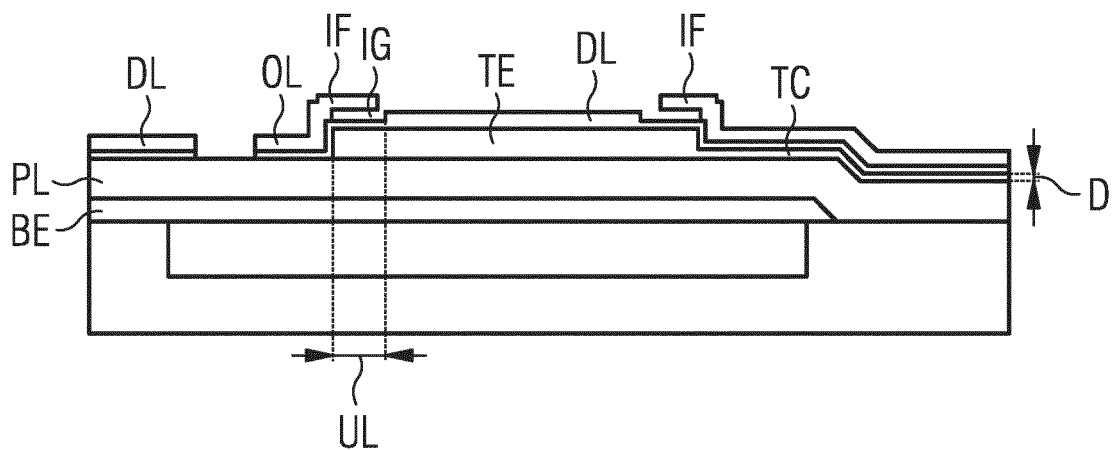
FIG. 4 shows an embodiment that has the same features of the FIG. 2 embodiment, but has a TE connection electrode that is thinner than the active region electrode.

FIG. 4 shows a cross-sectional view through a BAW resonator according a third embodiment. This embodiment complies with the first embodiment with the exception that the thickness D of the top electrode in the top electrode connection TC is thinner than in the active region AR.

Figure 5:
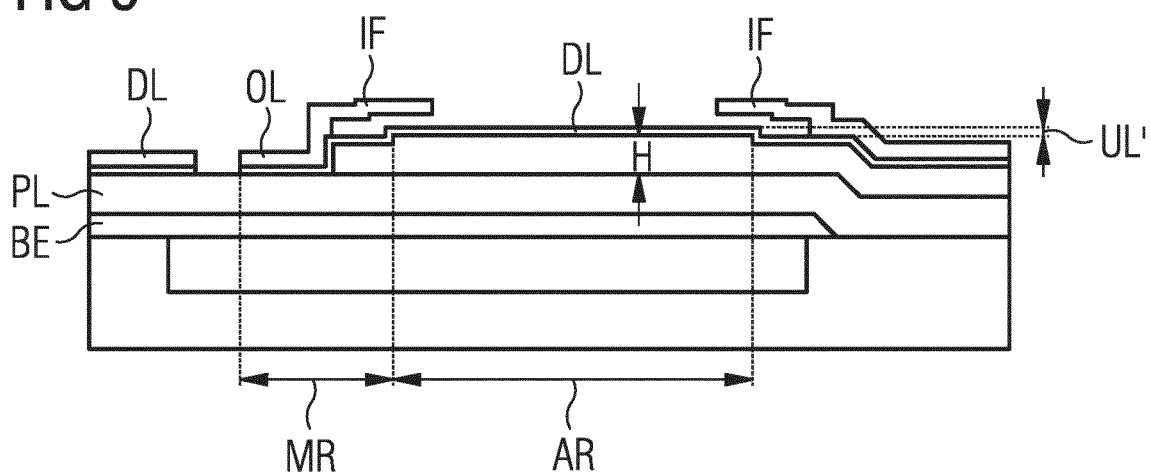
FIG. 5 shows in a cross-sectional view an embodiment that has the same features of the FIG. 2 embodiment, but has the under-lap being formed in the top electrode rather than in the passivation layer.

A fourth embodiment of the invention is shown in FIG. 5. This embodiment complies with the first embodiment as shown in FIG. 2 with the exeption that the thickness H of the top electrode TE in the active region AR is reduced by an underlap UL in the margin region. Thickness of passivation layer IS may be the same in the active region AR and in the margin region MR.

Figure 6:
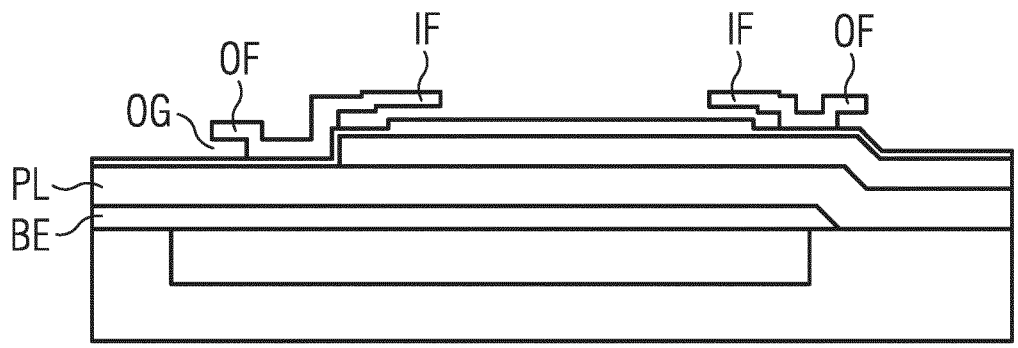
FIG. 6 shows in a cross-sectional an embodiment that has the same features of the FIG. 2 embodiment, but also includes optional outer-flaps in each of the following termination types: (i) non-connection, (ii) top-electrode connection, and (iii) bottom-electrode connection regions.

FIG. 6 shows a fifth embodiment. Along the whole perimeter of the active resonator region AR the dielectric layer DL/3D structure forms inner flaps IF as shown in FIG. 2. Along the whole perimeter of the active resonator region AR the dielectric layer forming the 3D structure additionally forms outer flaps OF where the dielectric layer extends the outer-lap OL in a distance to the surface passivation layer IS. Thereby, an outer gap OG is formed. All other features of this embodiment may comply with FIG. 2. However, the passivation layer IL covers the entire surface of the top electrode TE, the top electrode connection TC and may further cover the piezoelectric layer PL where it is not covered by the top electrode TE or top electrode connection TC. Hence, the trench TR that is present in the embodiments of FIGS. 2 to 5 is omitted.

In this embodiment, the outer flaps are optional feature for each termination type I, ii and iii.

Figure 7:
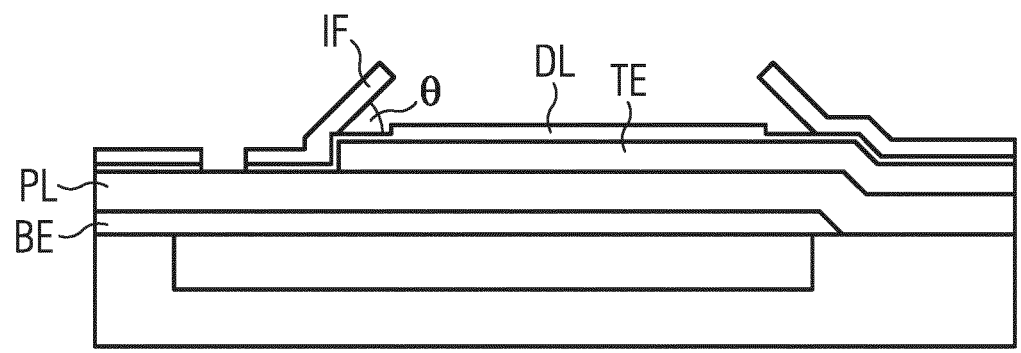
FIG. 7 shows in a cross-sectional view an embodiment that has the same features of the FIG. 2 embodiment, but has inner-flaps that are not entirely parallel to the device surface, but rather are formed with a particular angle, but are generally pointed inward toward the active area.

FIG. 7 shows a BAW resonator according to a sixth embodiment in a cross-sectional view. This embodiment that has the same features like the BAW resonator shown in FIG. 2 according to the first embodiment embodiment, but has inner-flaps IF that are not entirely parallel to the device surface, but rather are formed with a particular angle $\Theta$, but are generally pointed inward toward the active region AR.

Figure 8:
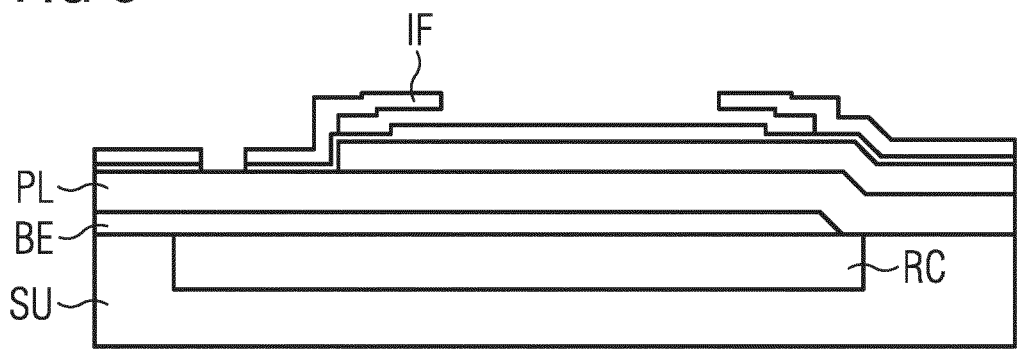
FIG. 8 shows an embodiment that has the same features of the FIG. 2 embodiment, but the bottom electrode (for type I and/or type ii terminations) is terminated before the substrate anchor point.

FIG. 8 shows a seventh embodiment that has the same features of the FIG. 2 embodiment with the exception that the bottom electrode BE (for type I and/or type ii terminations) is terminated before the substrate anchor point where the bottom electrode BE contacts the edge of the substrate SU in the recess RC.

The manufacture of the BAW resonator can be done in accordance with well-known processes. Each layer may be deposited separately and may be structures if requires after deposition. Deposition methods are sputtering, and CVD methods that can be plasma enhanced. The electrodes may be reinforced by galvanic process. Resist masks and photolithography may be used where required. Projecting parts (inner and outer flaps) are formed by means of a sacrificial layers underlying the projecting portion when applied as a layer. After lateral structuring the dielectric layer (precursor of the 3D structure) the sacrificial layer can be removed by etching. A sacrificial layer of $SiO_2$ can be selectively etched against SiN so that SiN can function as an etch stop. With other words, $SiO_2$ can be etched without removing the SiN of the dielectric 3D structure.

In the figures only one resonator is depicted respectively. In reality, on a large area substrate a number of BAW resonators may be manufactured in parallel. Circuiting such resonators to a filter circuit in a ladder type arrangement, electrical connections and circuitry can be manufactured in an integrated process.

As the invention has been depicted in few concrete embodiments only the scope of the invention may not be restricted to the specified embodiments. Further, embodiments are possible that combine features that are shown in different figures. Any other variation within the scope is possible too.

LIST OF USED REFERENCE SYMBOLS

AB air bridge
AR active resonator region
BC bottom electrode connection
BE bottom electrode
BM Bragg mirror
D thickness of top electrode in top electrode connection
DL dielectric layer forming 3D structures
G margin where 3D structure overlaps section of under-lap
H height of top electrode in active region
HI first material of high acoustic impedance
IF inner flap
IG inner gap
IL passivation layer
LI second material of low acoustic impedance
MR marginal region
OF outer-flap
OG outer gap
OL outer-lap
PL piezoelectric layer
RC recess in SU
SU substrate
TC top electrode connection
TE top electrode
TR trench
UL under-lap
Θ angle of inner-flaps in embodiment 6

We claim:

1. A bulk acoustic wave (BAW) resonator, comprising:
a substrate;
a bottom electrode disposed above the substrate;
a piezoelectric layer disposed above the bottom electrode;
a top electrode disposed above the piezoelectric layer and electrically terminated at one side edge by a top electrode connection;
an active resonator region formed by an overlap of the bottom electrode, the piezoelectric layer, and the top electrode;
an inner-flap formed by a dielectric 3D structure, wherein the inner-flap:
is disposed on a first marginal region of the active resonator region or adjacent to the first marginal region of the active resonator region,
extends inwardly towards a center of the active resonator region, and
has a section parallel to a top surface of the BAW resonator; and
an outer-flap disposed above the top electrode connection, wherein the outer-flap:
extends away from the active resonator region, and
has a projecting section parallel to the top surface of the top electrode connection such that an outer gap is maintained between the projecting section and the top surface of the top electrode.

2. The BAW resonator of claim 1, wherein:
the outer-flap and the inner-flap form a common 3D structure, and
the common 3D structure of the inner-flap and the outer-flap is at least partly arranged above a dielectric layer.

3. The BAW resonator of claim 1, wherein the outer-flap extends along a perimeter of the active resonator region such that an outer extending gap is maintained between the outer-flap and an underlying layer at all peripheral positions of the underlying layer.

4. The BAW resonator of the claim 3, wherein the inner-flap extends inwardly such that an inner gap of constant height is maintained between the inner-flap and the underlying layer.

5. The BAW resonator of claim 1, further comprising a second marginal region, wherein:
in the second marginal region the top electrode has a first thickness that is less than a second thickness of the top electrode in the active resonator region, and
the second marginal region forms a step to the center of the active resonator region.

6. The BAW resonator of claim 1, wherein the top electrode comprises a third marginal region, wherein:
in the third marginal region, a first thickness of an overlying passivation layer is less than a second thickness of the overlying passivation layer in the active resonator region, and
a third thickness of the top electrode is the same in the third marginal region and the active resonator region.

7. The BAW resonator of claim 6, wherein the inner-flap follows a topography of a surface of the top electrode in the third marginal region such that an inner gap with a constant height is maintained between the inner-flap and the surface of the top electrode.

8. The BAW resonator of claim 1, wherein a passivation layer covers the BAW resonator at least in the active resonator region.

9. The BAW resonator of claim 1, wherein the substrate comprises a recess below the active resonator region forming an air-filled cavity.

10. The BAW resonator of claim 1, wherein the substrate comprises a bragg mirror arranged below the active resonator region.

11. A bulk acoustic wave (BAW) resonator, comprising:
a substrate;
a bottom electrode disposed above the substrate;
a piezoelectric layer disposed above the bottom electrode;

a top electrode disposed above the piezoelectric layer and electrically terminated at one side edge by a top electrode connection;

an active resonator region formed by an overlap of the bottom electrode, the piezoelectric layer, and the top electrode;

an outer-flap disposed above the top electrode connection; and an inner-flap formed by a dielectric 3D structure, wherein:
the outer-flap and the inner-flap form a common 3D structure,
the common 3D structure of the inner-flap and the outer-flap is at least partly arranged above a dielectric layer, and
the inner-flap:
is disposed on a first marginal region of the active resonator region or adjacent to the first marginal region of the active resonator region,
extends inwardly towards a center of the active resonator region, and has a section parallel to a top surface of the BAW resonator.

12. The BAW resonator of the claim 11, wherein the inner-flap extends inwardly such that an inner gap of constant height is maintained between the inner-flap and an underlying layer.

13. The BAW resonator of claim 11, further comprising a second marginal region, wherein:
in the second marginal region the top electrode has a first thickness that is less than a second thickness of the top electrode in the active resonator region,
the second marginal region forms a step to the center of the active resonator region, and
the top electrode comprises a third marginal region, wherein:
in the third marginal region, a first thickness of an overlying passivation layer is less than a second thickness of the overlying passivation layer in the active resonator region, and
a third thickness of the top electrode is the same in the third marginal region and the active resonator region.

14. The BAW resonator of claim 13, wherein the inner-flap follows a topography of a surface of the top electrode in the third marginal region such that an inner gap with a constant height is maintained between the inner-flap and the surface of the top electrode.

15. A bulk acoustic wave (BAW) resonator, comprising:
a substrate;
a bottom electrode disposed above the substrate;
a piezoelectric layer disposed above the bottom electrode;
a top electrode disposed above the piezoelectric layer and electrically terminated at one side edge by a top electrode connection;
an active resonator region formed by an overlap of the bottom electrode, the piezoelectric layer, and the top electrode;
an outer-flap disposed above the top electrode connection; and
an inner-flap formed by a dielectric 3D structure, wherein:
the outer-flap extends along a perimeter of the active resonator region such that an outer extending gap is maintained between the outer-flap and an underlying layer at all peripheral positions of the underlying layer, and
the inner-flap:
is disposed on a first marginal region of the active resonator region or adjacent to the first marginal region of the active resonator region,
extends inwardly towards a center of the active resonator region.

16. The BAW resonator of the claim 15, wherein the inner-flap extends inwardly such that an inner gap of constant height is maintained between the inner-flap and an underlying layer.

17. The BAW resonator of claim 15, further comprising a second marginal region, wherein:
in the second marginal region the top electrode has a first thickness that is less than a second thickness of the top electrode in the active resonator region,
the second marginal region forms a step to the center of the active resonator region, and the top electrode comprises a third marginal region, wherein:
in the third marginal region, a first thickness of an overlying passivation layer is less than a second thickness of the overlying passivation layer in the active resonator region, and
a third thickness of the top electrode is the same in the third marginal region and the active resonator region.

18. The BAW resonator of claim 17, wherein the inner-flap follows a topography of a surface of the top electrode in the third marginal region such that an inner gap with a constant height is maintained between the inner-flap and the surface of the top electrode.

* * * * *